(12) United States Patent
Fredholm et al.

(10) Patent No.: US 7,306,673 B2
(45) Date of Patent: Dec. 11, 2007

(54) FURNACE PURIFICATION AND METAL FLUORIDE CRYSTAL GROWN IN A PURIFIED FURNACE

(75) Inventors: Michelle M. L. Fredholm, Hericy (FR); Jeffrey T. Kohli, Corning, NY (US); Nicholas LeBlond, Painted Post, NY (US); Alexandre M. Mayolet, Corning, NY (US); Viktoria Pshenitsyna, St. Petersburg (RU); Pawan Saxena, Corning, NY (US); Paul M. Schermerhorn, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 376 days.

(21) Appl. No.: 10/971,315

(22) Filed: Oct. 22, 2004

(65) Prior Publication Data

US 2006/0037531 A1    Feb. 23, 2006

(51) Int. Cl.
*C30B 11/00*    (2006.01)
(52) U.S. Cl. .................. 117/68; 117/71; 117/77; 117/78; 117/82; 117/3; 117/4; 117/940

(58) Field of Classification Search ........... 117/68, 117/77, 78, 71, 82, 940, 3, 4
See application file for complete search history.

(56) References Cited

U.S. PATENT DOCUMENTS

| | | | |
|---|---|---|---|
| 6,238,479 B1 * | 5/2001 | Oba .................. | 117/68 |
| 6,270,570 B2 | 8/2001 | Ohba et al. .......... | 117/76 |
| 6,333,922 B1 | 12/2001 | Campanella ......... | 370/319 |
| 6,395,657 B2 | 5/2002 | Mayolet et al. ...... | 501/3 |
| 6,562,126 B2 | 5/2003 | Price ................ | 117/81 |
| 6,630,117 B2 | 10/2003 | Sparrow ............. | 423/490 |
| 2003/0019422 A1 * | 1/2003 | Herve ............... | 117/81 |
| 2003/0070606 A1 * | 4/2003 | LeBlond et al. ...... | 117/84 |

* cited by examiner

*Primary Examiner*—Yogendra N. Gupta
*Assistant Examiner*—Matthew J. Song
(74) *Attorney, Agent, or Firm*—Walter M. Douglas

(57) ABSTRACT

The invention is directed to a method for growing metal fluoride crystals suitable for use in below 200 nm optical lithography systems, the method comprising including at least the step of heating a crystal growth furnace to a temperature in the range of 1400-2000° C. to purify the furnace by removal of sulfur and chlorine prior to using the furnace for growing metal fluoride single crystals.

12 Claims, 5 Drawing Sheets

PRIOR ART FURNACES

US 7,306,673 B2

FURNACE PURIFICATION AND METAL FLUORIDE CRYSTAL GROWN IN A PURIFIED FURNACE

CROSS-REFERENCE TO RELATED APPLICATION

This application claims the benefit of priority under 35 U.S.C. § 119 of European Patent Application Ser. No. 04292065.2 filed on Aug. 20, 2004.

FIELD OF THE INVENTION

The invention is directed to the preparation of metal fluoride single crystals that are suitable for use in optical lithographic systems, especially systems operating at wavelengths below 200 nanometers. In particular, the invention is directed to the purification of the equipment used in the preparation of metal fluoride single crystals, including the purification of the interior of a crystal growth and/or annealing furnace and the components located within such furnace.

BACKGROUND OF THE INVENTION

The burden of the demands for the improved performance of computers and other electronic devices falls on the lithographic processes used to fabricate integrated circuit chips. Lithography involves irradiating a mask and focusing the pattern of this mask through an optical microlithography system onto a wafer coated with a photoresist. The pattern on the mask is thereby transferred onto the wafer. Decreasing the line-widths of the features on a given wafer brings about advances in performance. The enhanced resolution required to achieve finer line-widths is accomplished by decreasing the wavelength of the illumination source. As a result, the energies used in lithographic patterning are moving deeper into the UV region. In particular, projection optical photolithography systems and <200 nm excimer laser systems that utilize vacuum ultraviolet ("VUV") wavelengths of light at and below 200 nm provide desirable benefits in terms of achieving smaller feature dimensions. Consequently, optical components capable of reliable performance at short optical microlithography wavelengths are required.

Few materials are known to both have a high transmittance at wavelengths below 200 nm (for example, at 193 nm and 157 nm) and also not deteriorate under intense laser radiation exposure. Fluoride crystals such as those of magnesium fluoride, calcium fluoride and barium fluoride are potential materials for use at wavelengths <200 nm.

The commercial use and adoption of 193 nm and below vacuum ultraviolet wavelengths has been hindered by the transmission nature of such deep ultraviolet wavelengths through optical materials. The slow progression in the use of VUV light below 200 nm by the semiconductor industry has been also due to the lack of economically manufacturable, high quality blanks of optically transmissive materials suitable for making

SUMMARY OF THE INVENTION

The present invention relates to a method of growing metal fluoride crystals suitable for use in optical lithography systems, and particularly crystals suitable for use in systems using <200 nm electromagnetic radiation. In one of its aspects the invention relates to a method of purifying the interior of a furnace, including the components therein, of substances that can contaminate metal fluoride single crystals during their growth and/or annealing. In one embodiment the purification is done prior to the introduction of any metal fluoride materials into the furnace and involves heating the interior of the furnace to a temperature range above the melting point of the metal fluoride crystal that is to be prepared. Preferably the temperature should be substantially higher than any temperature that will be reached by any part of the furnace while the metal fluoride feedstock is present. Typically such heating is either to a temperature in the range of at least 50° C. to 600° C. higher than the melting point of the metal fluoride crystal or to a maximum temperature of approximately 2000° C. Since the alkaline earth metal fluorides have melting points (° C.) of $BaF_2$=1280, $NgF_2$=1266, $CaF_2$=1418 and $SrF_2$+−1450, the temperatures used in purifying the furnace are in the range of 1300-2000° C., preferably 1400-2000° C. When it is known that a furnace will be dedicated to making one type of crystal, for example, $CaF_2$, the temperature range can adjusted accordingly. Thus, in the case of $CaF_2$ the range would be ~1420-2000° C., preferably ~1420-1600° C.

The heating can be done either with the furnace having a gaseous atmosphere, preferably of an inert gas (for example, argon, helium, nitrogen, or inert gas) or when the furnace under vaouum. Heating under vacuum is preferred because volatile substances are continuously removed during the heating process. Alternatively, the heating can be done in the presence of an inert gas and the furnace periodically evacuated and refilled with the inert gas until the selected purification time is completed. The furnace is maintained at the maximum temperature for a time of at least 4 hours, generally for a time in the range of 4-96 hours, prior to cooling back to ambient temperature (18-30° C.) and being loaded with a vessel containing a metal fluoride feedstock for growing a metal fluoride crystal. The exact time for purification is dependent on the nature and level of contaminants. For example, when elements of the furnace such as the insulation are known to contain considerable amounts of sulfur, for example, 200-400 ppm, longer purification times may be required as further explained herein, including extending the time beyond 96 hours.

In one embodiment the invention is directed to a method for growing a metal fluoride single crystal in a furnace, said method comprising the steps of evacuating to at least $10^{-5}$ Torr a furnace suitable growing metal fluoride single crystals; heating the furnace to a temperature in the range of 1400-2000° C. with continuous application of vacuum and holding the furnace at the temperature for a time of at least 12 hours, generally for a time in the range of 12-24 hours; cooling the furnace to a temperature of 1400-1500° C.; admitting a selected gas into the furnace and holding the temperature of 1400-1500° C. for a time of at least 4 hours, generally for a time in the range of 4-12 hours; evacuating the furnace to at least $10^{-6}$ Torr; cooling the furnace to ambient temperature; admitting a dry, inert gas into the furnace; placing at least one vessel containing a metal fluoride feedstock into the furnace; and heating, melting and cooling the feedstock by any procedure known in the art to thereby grow a metal fluoride single crystal.

In another embodiment the invention relates to purifying a furnace and its interior components when a vessel containing a metal fluoride feedstock is present in the furnace. In this embodiment the furnace is preferably evacuated prior to the beginning of heating and vacuum is continuously maintained while the furnace is being heated to a temperature that is 50-100° C. below the melting point of the metal fluoride feedstock present in the furnace. The furnace is maintained at such temperature for a time of at least 4 hours, generally for a time in the range of 4-96 hours, prior to heating the furnace to a temperature sufficient to melt the metal fluoride feedstock and subsequently growth of a metal fluoride crystal.

In both of the foregoing embodiments a $C_1$-$C_4$ alkane or alkene fluorocarbon gas or a $C_1$-$C_4$ chorofluorocarbon gas and/or hydrogen gas is preferably introduced into the furnace at some point during heating as a replacement for vacuum or the inert gas to aid in purifying the furnace and its components. Fluorocarbon, chlorofluorocarbon, hydrogen and deuterium gases, or mixtures thereof, can penetrate and react with both surface and bulk material impurities before the metal fluoride material has melted and is at such time critically exposed to impurities that may be present in the furnace described above.

DETAILED DESCRIPTION OF THE INVENTION

The invention is directed to the growth and/or annealing of metal fluoride crystals of formulas $MF_2$, where M is calcium, barium, magnesium and strontium, or mixtures of the foregoing in any proportion. The method of the invention can also be used to grow other crystals, for example, metal fluoride crystals of formula M'F, where M' is an alkali metal such as potassium, lithium, cesium, rubidium or mixtures thereof. In this Detailed Description calcium fluoride, $CaF_2$, will be used to exemplify the invention. However, it should be clearly understood that the invention relates to all the forgoing metal fluorides or mixtures of metal fluorides. All "ppm" or "ppb" values given herein are by weight.

Optical crystals can be grown by any of several methods known in the art; for example the Stockbarger, Bridgman-Stockbarger and Czochralski methods, and the methods described in U.S. Pat. Nos. 6,630,117, 6,395,657, and 6,333, 922 B1. Any other time/temperature regimes known in the art can also be used to grow crystals and the invention is independent of such growth procedures. With regard to the furnace itself, in the Bridgman-Stockbarger method, the optical crystals are grown in a vertical furnace by moving molten crystal material through a temperature gradient zone in the furnace; that is from a first hot or melting zone into a second or cooling zone. The cooling zone can also be used for annealing the crystals and is sometime referred to as the "annealing zone" or the "cooling/annealing zone". In some methods described in the art the crystal is grown in a "growth" furnace and after cooling the crystal to ambient temperature, it is transferred to an "annealing" furnace to remove strains present in-the crystal and thus improve the quality of the crystal. The invention as described herein can be used with either a growth furnace or an annealing furnace.

Figure 4:
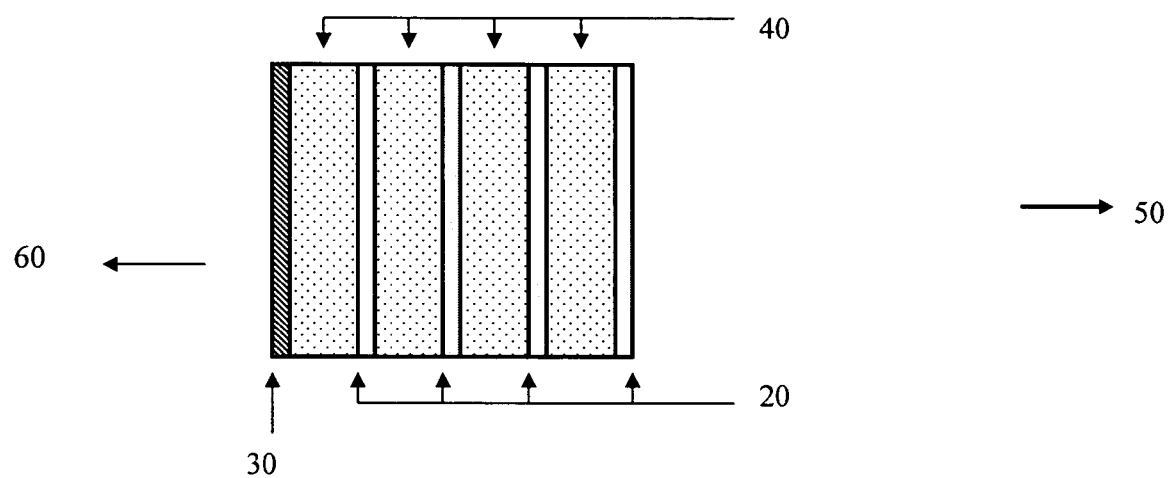
FIG. 4 illustrates a typical type of carbon insulation used in a furnace.

Furnaces useful for growing metal fluoride crystals are known in the art and any such furnaces can be used in practicing the invention. Briefly, such furnaces have among their elements an outer shell; one or a plurality of heaters with controllers for controlling the heating elements either independently or in unison; interior and sometimes exterior insulation; generally a diaphragm or baffle that separates the furnace in two zones that are typically referred to as the first or upper or melting zone, and the second or lower or cooling (or cooling/annealing) zone; a mechanism for translating a vessel containing the metal fluoride feedstock and/or melt from upper zone to the lower zone; temperature sensors such as are known in the art; a port for the application of vacuum and the associated vacuum equipment; and one or a plurality of ports for admission and exit of gaseous substances, for example, for admission and/or flow-through of an inert gas or a scavenging gas. The furnaces may also have other elements as described in the art and such furnaces are to be included among those with which the invention can be used. An example of the typical insulation used in a furnace is illustrated in FIG. 4. This insulation material consists of graphite felt 40 sandwiched between layers of a graphite foil 20 and a carbon fiber composite material 30 as illustrated. The layers are held together using a colloidal graphite cement. Arrow 50 indicates the direction of the heating elements and arrow 60 indicates the direction of the cooled outer wall of the furnace.

Using $CaF_2$ as an exemplary metal fluoride, it is imperative that $CaF_2$ single-crystals manufactured for <200 nm lithography applications be free of impurities that cause light scattering or absorption centers in the crystal. Oxygen, hydroxyl, and related impurities are known to degrade the 193 and 157 nm transmissions of $CaF_2$ crystals. Other impurities include transition metals such as iron and vanadium, alkali metals such as sodium, sulfur, phosphorus, lead and other elements know in the art to be detrimental to the transmission of <200 nm electromagnetic radiation. The source of these impurities may not only be the raw materials or the ambient gas environment of the furnace, but also the components that make-up the furnace in which the raw materials are prepared and/or the $CaF_2$ crystal is grown.

A key source of these impurities is the graphite and metallic components that make-up the internal regions of the furnace. When these components are exposed to ambient conditions, especially between furnace cycles, they immediately adsorb or otherwise incorporate impurities that ultimately degrade the quality of the crystal (by diffusion into the $CaF_2$ material, especially at temperatures near or above the melting temperature of $CaF_2$). Since, in an industrial environment these furnaces are often large and numerous, it is impractical and cost prohibitive to continuously maintain these furnaces and their components in an environment that is free of impurities. In addition, since many different oxygen scavengers may be used in the preparation of $CaF_2$ crystals, impurities such as Pb, Zn, and others arising the addition of the oxygen-scavengers may be present in the furnaces. While ideally these impurities are evolved from the $CaF_2$ material as PbO, ZnO (or other species depending on the exact scavenger being used) during the crystal manufacturing process and are evacuated from the furnace, in actual fact these and other elements may actually contaminate the furnace and its components with repeated use (cycling) of the furnace.

The objective of the present invention is to use a cleaning gas to purify the furnace and its components either using a "high" temperature heating regime before the furnace is loaded with raw materials or using a "low" temperature regime after the furnace has been loaded with raw materials and has been closed to the ambient environment. As used herein, a "high" temperature regime means one in which the furnace is heated to a temperature greater than the melting point of the metal fluoride being used to grow a crystal. Such high temperatures are in the range of from above the melting temperature of the metal fluoride to approximately 2000° C.; preferably in the range of at least 50° C. to 600° C. above the melting point of the metal fluoride being used to grow a single crystal. Generally, the purifying high temperature range is 1400-2000° C. A "low" temperature regime means one in which the maximum temperature during furnace purification is below the melting point of the metal fluoride being used to grow a single crystal. Such low temperatures are in the range of 600° C. to 100° C. below the melting point of the metal fluoride.

As part of the purification process a purifying gas, either alone or mixed with an inert gas such as helium, argon, neon or nitrogen, is admitted to the furnace during the purification process. The purifying gas may be a $C_1$-$C_4$, straight chain or cyclic, alkane or alkene fluorocarbon gas, a $C_1$-$C_4$ chlorofluorocarbon gas, and/or hydrogen or deuterium gas, or a mixture of the foregoing gases. The preferred gas is a fluorocarbon gas. When a chlorofluorocarbon gas is used initially, it is preferred that the purifying treatment end with the use of a fluorocarbon gas (contains no chlorine).

Figure 1:
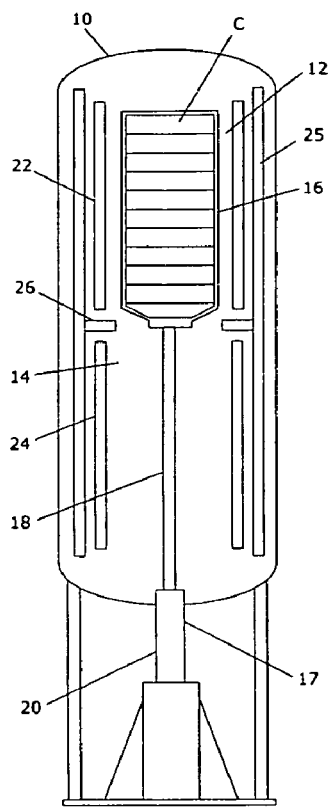
FIG. 1 illustrates two prior art crystal growth furnaces as shown in U.S. Pat. No. 6,562,126 B2 (Corning Inc.) and U.S. Pat. No. 6,270,570 B2 (Canon Kabushiki Kaisha).
Figure 1:
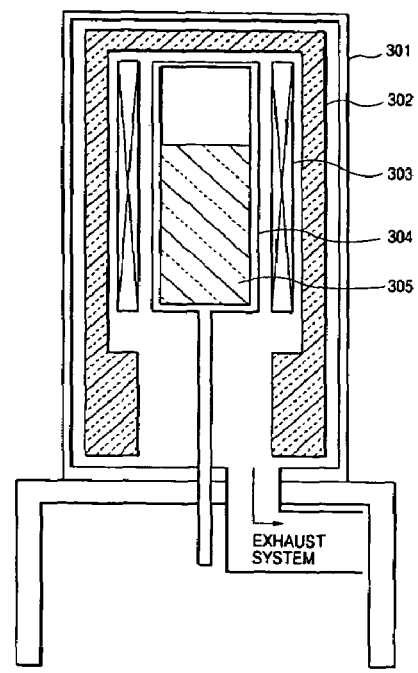
Figure 2:
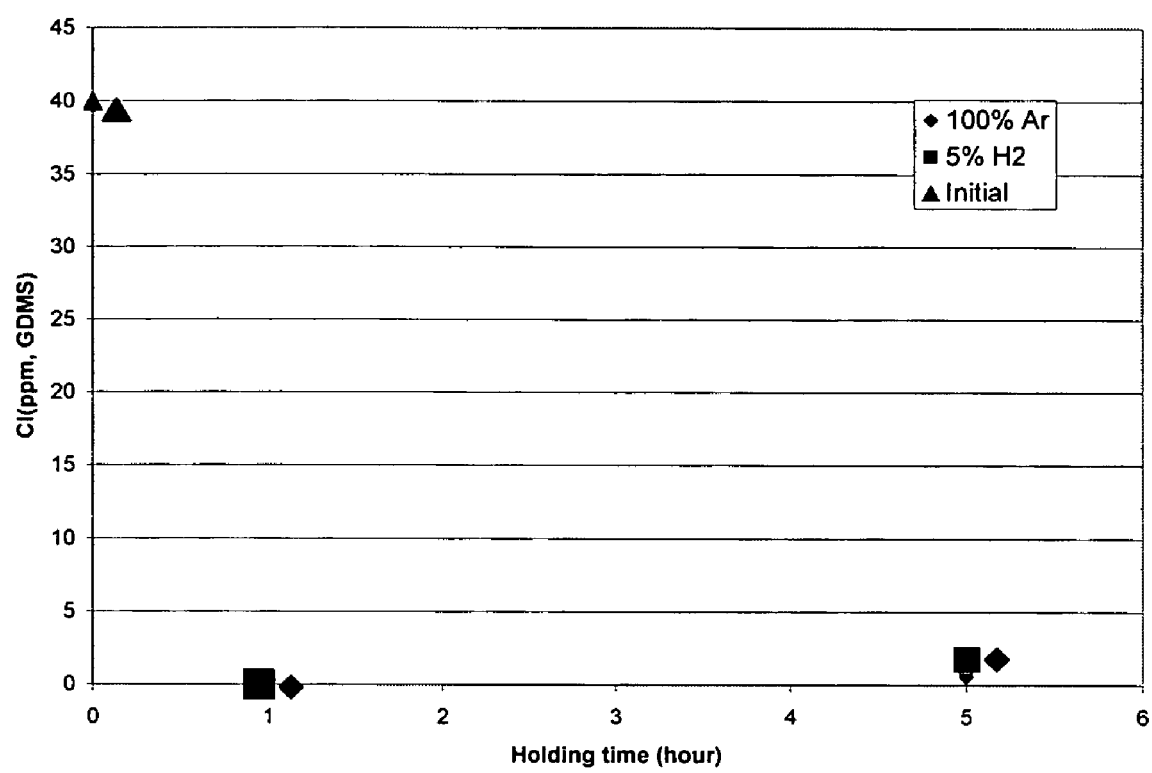
FIG. 2 illustrates the variation in chlorine content as measured by GDMS in a Carbon bonded carbon filer insulation sample heat treated at 2000° C. in a dynamic flow of either 100% argon or 5% H2 in argon.

To understand the conditions necessary for purifying a furnace, experiments were carried out using simple thermal treatment by heating graphite insulation to selected temperatures to determine the mechanism for the elimination of chlorine and sulfur from the insulation (felt and foam, etc,) and other elements of the furnace. The experiments indicated that the driving force to remove chlorine is the temperature of the treatment in either a dynamic gas flow condition (that is, a selected gas being flowed through the furnace) or in vacuum. It was determined that the dynamic flow of fluorocarbon at high temperature, or hydrogen and/or deuterium flow at lower temperatures, helps to remove the chlorine; for example, at temperatures below 1000° C. At a temperature of approximately 2000° C., hydrogen does not further help. This was determined by heat treating a carbon-bonded carbon fiber ("CBCF") sample having known initial chlorine content to 2000° C. in argon and hydrogen in a graphite furnace. FIG. 2 shows the variation in chlorine content as measured by GDMS in a CBCF sample heat treated at 2000° C. in a dynamic flow of either 100% argon or 5% $H_2$ in argon. FIG. 2 indicates that at 2000° C. treatment in argon or argon/hydrogen reduces the chlorine and gives rise to identical chlorine concentrations.

Figure 3:
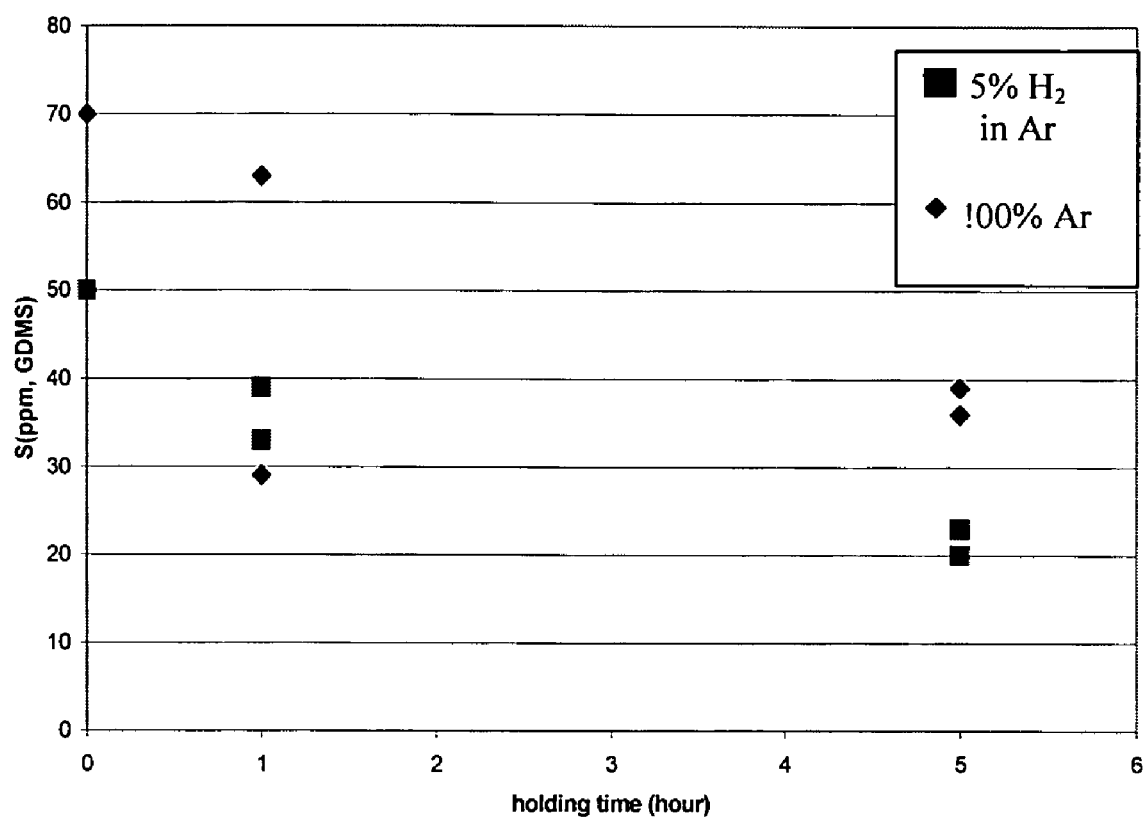
FIG. 3 illustrates the variation of the sulphur content for the same carbon insulation sample as FIG. 2.

FIG. 3 shows the variation of the sulphur content for the same samples as tested in the previous paragraph. In contrast to FIG. 2, it appears that the sulphur elimination proceeds much more slowly than chlorine elimination. As a result, sulfur elimination requires a longer holding time at 2000° C., or the temperature has to be increased in order to drastically reduce the sulphur content. As a result of these experiments, it is believed that insulation contains a high sulfur concentration and that the sulphur will be released over a long period of time at lower temperatures ("T"), for example in the range of 1200° C.<T<1500° C.).

The results shown in FIGS. 2 and 3 suggest that chlorine is significantly reduced by fluorocarbon purification. Without being held to any theory, it is believed that the chlorine is associated with impurities bonded to the graphite. The introduction of a gas helps convection heating of the graphite insulation. In addition, the sulphur appears to be bonded to the graphite structure as well. The elimination of sulphur is thermally driven and is accomplished slowly since it is believed to require the severing of carbon-sulfur bonds. It was found that the sulfur content can be reduced using high temperatures which activate carbon sulfur bonds. The use a selected gas such as a chlorocarbon or fluorocarbon is believed to aid in removing the sulfur from the furnace by reacting with the carbon-sulfur bond and providing a volatile sulfur species that can be removed by vacuum. For example, $CF_4$ can be used at a temperature of approximately 1400°.

As an example of how the invention can be used to purify a furnace, a sample of a carbon-bonded carbon fiber ("CBCF") insulation was heat treated at 1600° C. in 10% $CF_4$ (in an inert gas) under dynamic conditions (flowing the $CF_4$ mixture through the furnace) for 48 hours. The $CF_4$ treatment resulted in a reduction of all the impurities (alkaline, metals, transitions metals and rare earth) as shown below in Table 1. The analysis of two samples taken from different parts of the furnace shows some inhomogeneity in term of impurities distribution. However, overall there is a reduction in all impurities. $CF_4$ has cleaned the insulation and the distribution in impurities is believed related to the thermal distribution in the furnace. Surprisingly, no evidence of sulphur reduction is detected using glow discharge mass spectrometry ("GDMS"). In fact, the GDMS analysis shows more sulfur after purification than before. However a brown dark deposition onto "cold" (relatively) part of the furnace was analyzed by energy dispersive X-ray analysis ("EDX") showing evidence of sulphur volatilization.

TABLE 1

CBCF before and after a $CF_4$ treatment.

| ppm | Not purified | $CF_4$ Treatment (1) | $CF_4$ Treatment (2) |
|---|---|---|---|
| Cl | 6 | 0.3 | <0.1 |
| S (GDMS) | 195 | 254 | Not Analyzed |
| Na | 77 | 0.08 | 0.8 |
| K | 196 | 0.5 | 1.8 |
| Cr | 159 | 9.1 | 10.5 |
| Fe | 340 | 30 | 6 |
| La | 1.7 | 0.02 | 0.17 |
| Ce | 0.3 | 0.01 | 0.09 |

In another example insulation was purified, and both the chlorine and sulfur content of the insulation were determined. The results are shown in Table 2. Sulfur was determined using the GDMS technique. The analytical results indicate that the insulation material as-received contained considerable chlorine and sulfur. After treatment with $CF_4$ in accordance with the invention both materials, S and Cl, were reduced; the chlorine being reduced by approximately 98% and the sulfur being reduces by about 73%. The treatment was carried at a temperature of 1600° C. for 48 hours using 10% $CF_4$ in argon gas flow (flow rate: 300 ml/min)

TABLE 2

Chlorine and sulphur analysis before and after a $CF_4$ treatment

| ppm | CBCF* | After $CF_4$ process |
|---|---|---|
| Cl (NAA) | 197 +/− 6 | 3 +/− 0.23 |
| S (GDMS) | 150 | 40 |

*The CBCF material was pre-purified by the manufacturer prior to $CF_4$ treatment as described.

The results also indicate that it is important to be careful when using $CF_4$ as an oxygen-scavenging/fluorinating agent during CaF$_2$ crystal manufacture, especially when the furnace and its contents have not been pre-purified as taught herein. Chlorine can be liberated from the insulation during this process and can contaminate any metal fluoride material in the furnace. In addition, extreme care should be taken in choosing the insulation material in order to avoid having the CF$_4$ react with and clean metallic impurities from the furnace. In addition, it is important to thermally passivate the furnace prior to its being used to manufacture metal fluoride crystals such as CaF$_2$. This passivation is done by heating the furnace to a temperature of at least 1550° C. for 48 hours or longer.

Using the above information, a method for purifying a furnace before using it to grow metal fluoride crystals was developed. In one embodiment the furnace is sealed, evacuated to a pressure of less than 10$^{-5}$ Torr and heated to a temperature of in the range of 400-700° C. for a time of at least 4 hours, generally a time in the range of 4-12 hours, with continuous application of vacuum to remove easily volatile materials. The temperature is then raised to 1400-1500° C. with continued application of vacuum and held at this temperature for a time of at least 12 hours, generally a time in the range of 12-24 hours. Subsequently, a fluorocarbon gas such as CF$_4$ (or a CF$_4$/inert gas mixture) is admitted into the furnace and the gas is held at temperature for an additional 12-24 hours. Vacuum is then applied to the furnace to exhaust volatile impurities. The temperature is then raised to approximately 2000° C. and held for an additional 12-24 hours to remove as much sulfur as possible. If it is known that the insulation contains sulfur in the range of 200-400 ppm, or higher, the time can be extended, for example, up to 48-72 hours or longer. The furnace is then cooled back to 1400° C., CF$_4$ admitted and the furnace held at this temperature under dynamic conditions; that is, with a continuous purge of CF$_4$ through the furnace. Subsequently, the furnace is cooled to ambient temperature, preferably under vacuum, so that it can be loaded with one or more vessels containing metal fluoride raw material and used to grow and/or anneal a metal fluoride single crystal, or for use an annealing furnace.

In another embodiment the furnace is sealed, evacuated to a pressure of less than 10$^{-5}$ Torr and the temperature raised to a temperature in the range of 400-700° C. with continuous application of vacuum. Subsequently, the furnace is filled with a fluorocarbon gas, for example, CF$_4$, and a purge of CF$_4$ gas is maintained while the furnace is raised to a temperature in the range of 1400-1500° C. and maintained at this temperature for a time of at least 12 hours, generally for a time in the range of 12-24 hours. The CF$_4$ purge is then stopped, the furnace evacuated to a pressure of less than 10$^{-5}$ Torr and cooled to ambient temperature while maintaining vacuum. Once at ambient temperature a dry gas, preferably an inert gas such as helium, argon or nitrogen, is admitted into the furnace so that it can be loaded with one or more vessels containing metal fluoride raw material and used to grow a crystals, or loaded with a grown crystals that is then annealed. If the furnace is believed to contain high amounts of sulfur, after the flow of CF4 is stopped when the furnace is at 1400-1500-° C. the furnace is evacuated to less than 10$^{-5}$ Torr, heated to a temperature in the range of 1800-2000° C. and held in this temperature range for at least 12 hours, generally for a time in the range of 12-24 hours, in continuous vacuum. It is then cooled back to 1400° C. and re-purged with CF$_4$ for a time in the range of 12-24 hours prior to cooling to ambient temperature.

In a third embodiment, the method of the first embodiment is carried out using a chlorofluorocarbon gas followed by treatment with a fluorocarbon gas. The fluorocarbon gas treatment is necessary to minimize the residual chlorine in the furnace so that it will not contaminate a metal fluoride crystal grown in the furnace.

Figure 5:
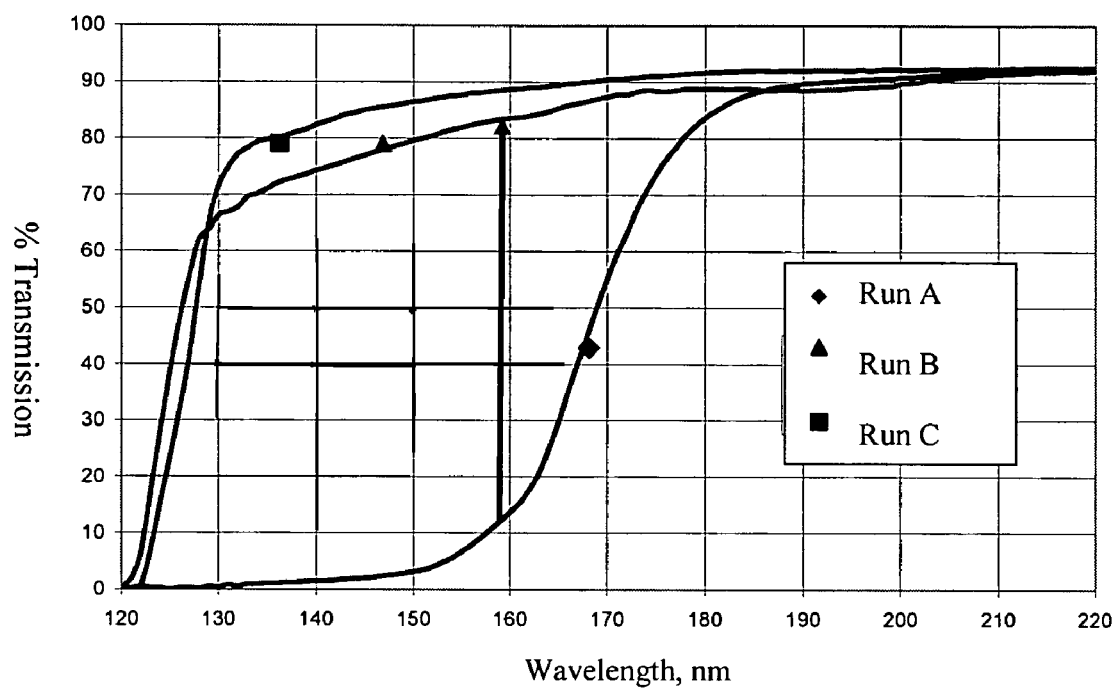
FIG. 5 illustrates the transmission of $CaF_2$ single crystal grown in a furnace before and after purification according to the invention.

Several CaF$_2$ crystals growth runs were carried out before and after the furnace was purified according to the invention. The results are summarized in FIG. 5. Run A was carried out with an unpurified furnace. Runs B and C were carried out after furnace purification. The upward arrow ↑ indicates the change in the transmission properties in a crystal grown in the furnace after purification. While the further improvement in transmission properties from Run B to Run C is believed due to further removal of contaminants, the dramatic results between Runs A and B indicate the importance of purifying a furnace prior to growing, or annealing, metal fluoride single crystals.

As one skilled in the art will recognize, other combination of heating and treating with a chlorofluorocarbon and/or fluorocarbon gas and other time temperature regimes are possible using the disclosures made herein. Such addition regimes are intended to be within the scope of the invention.

The invention claimed is:

1. A method for growing metal fluoride single crystals in a crystal growth furnace, the method comprising the steps of:
    of placing a vessel containing a metal fluoride feedstock into a crystal growth furnace;
    heating the feedstock to a temperature above the melting point of the feedstock; and
    cooling the melted feedstock to form a metal fluoride single crystal, wherein,
    (a) prior to placing a metal fluoride feedstock into the furnace to grow the crystals, the furnace is purified at a temperature that is in the range of from above the melting point of the metal fluoride crystal that is to be grown in the furnace to 2000° C., said purification for a time of at least 12 hours; and
    (b) the furnace purification temperature is in the range of at least 50° C. to 600° C. above the melting point of the metal fluoride crystal to be grown, and
    (c) the purification procedure for said furnace comprises the steps of:
    evacuating to at least 10$^{-5}$ Torr a furnace suitable growing metal fluoride single crystals,
    heating the furnace to a temperature in the range of 1400-2000° C. and for said time with continuous application of vacuum;
    cooling the furnace to a temperature of 1400-1500° C.;
    admitting a selected gas into the furnace and holding the temperature of 1400-1500° C. for a time of at least 4 hours;
    evacuating the furnace to at least 10$^{-6}$ Torr;
    cooling the furnace to 18-30° C.; and
    admitting a dry, inert gas into the furnace prior to placing a metal fluoride feedstock into the furnace to grow the crystals.

2. The method according to claim 1, wherein the furnace purification temperature is higher than any temperature occurring in the furnace in the presence of the metal fluoride.

3. The method according to claim 1, wherein the furnace purification temperature is higher than any temperature occurring in the furnace in the presence of the metal fluoride.

4. The method according to claim 1, wherein prior to heating the furnace to a temperature above the melting point of the crystal to be grown, the furnace is heated to a temperature in the range of 400-700° C. for a time or at least 4 hours to remove easily volatile materials.

5. The method according to claim 1, wherein prior to heating the furnace to a temperature above the melting point of the crystal to be grown, the furnace is heated to a temperature in the range of 400-700° C. for a time or at least 4 hours to remove easily volatile materials.

6. The method according to claim 1, wherein the selected gas is a chlorofluorocarbon, a fluorocarbon or hydrogen, or a mixture of any of the foregoing in an inert gas.

7. The method according to claim 1, wherein the selected gas is a chlorofluorocarbon, and after the chlorofluorocarbon gas is evacuated from the furnace the furnace is treated with a fluorocarbon gas at 1400-1600° C. for a time or at least 4 hours, evacuated, and then cooled to ambient temperature.

8. The method according to claim 1, wherein after the vessel containing the metal fluoride is placed in the furnace, the furnace evacuated to at least $10^{-5}$ Torr, heated to a temperature in the range of 400-700° C., charged with a fluorocarbon gas to a pressure in the range of 0.1 to less than 1.0 atmosphere, prior to melting the metal fluoride material and growing a metal fluoride crystal.

9. The method according to claim 1, wherein prior to heating the furnace to a temperature above the melting point of the crystal to be grown or to a temperature in the range of 1400-2000° C., the furnace is heated to a temperature in the range of 400-700° C.; a fluorocarbon gas or a mixture of a fluorocarbon gas in an inert gas is admitted into the furnace, and a purge of the fluorocarbon gas or gas mixture is maintained while the furnace heated to a temperature in the range of 1400-1500° C.; the temperature is held in this range for at least 4 hours and the furnace is then evacuated prior to heating to a temperature in the range of 1400-2000° C.

10. The method according to claim 9, wherein said method is used to grow a metal fluoride single crystal wherein the metal is calcium, barium, magnesium or strontium, or a mixture of any of the foregoing.

11. The method according to claim 1, wherein said method is used to grow a metal fluoride single crystal wherein the metal is calcium, barium, magnesium or strontium, or a mixture of any of the foregoing.

12. The method according to claim 1, wherein said method is used to grow a metal fluoride single crystal wherein the metal is calcium, barium, magnesium or strontium, or a mixture of any of the foregoing.

* * * * *